(12) United States Patent
Fontaine et al.

(10) Patent No.: US 7,243,288 B1
(45) Date of Patent: Jul. 10, 2007

(54) METHOD AND APPARATUS FOR TURBO DECODING BLOCK CODES

(75) Inventors: Frederic Fontaine, New York, NY (US); Stephen B. Wicker, Ithaca, NY (US)

(73) Assignee: Motorola Inc., Schaumburg, IL (US)

( * ) Notice: Subject to any disclaimer, the term of this patent is extended or adjusted under 35 U.S.C. 154(b) by 1448 days.

(21) Appl. No.: 09/602,339

(22) Filed: Jun. 24, 2000

(51) Int. Cl.
*H03M 13/13* (2006.01)
*H03M 13/29* (2006.01)

(52) U.S. Cl. ..................... 714/755; 714/780
(58) Field of Classification Search ............... 714/755, 714/780, 792
See application file for complete search history.

(56) References Cited

U.S. PATENT DOCUMENTS

| | | | | |
|---|---|---|---|---|
| 5,157,671 A * | 10/1992 | Karplus | ....................... | 714/752 |
| 5,930,272 A * | 7/1999 | Thesling | ..................... | 714/752 |
| 6,122,763 A * | 9/2000 | Pyndiah et al. | ............. | 714/755 |
| 6,539,367 B1 * | 3/2003 | Blanksby et al. | ............. | 706/14 |
| 6,625,775 B1 * | 9/2003 | Kim | ........................... | 714/755 |
| 6,751,770 B2 * | 6/2004 | Morelos-Zaragoza | ....... | 714/781 |

OTHER PUBLICATIONS

Hagenauer et al., "Iterative Decoding of Binary Block and Convolutional Codes", IEEE Transactions on Information Theory, vol. 42, No. 2, Mar. 1966, pp. 429-445.*

Goalic et al., "Real-Time Turbo-Decoding of Product Codes on a Digital Signal Processor", 1997 IEEE GLOBECOM, Nov. 1997, pp. 624-628.*

Lucas et al., "On Iterative Soft-Decision Decoding of Linear Binary Block Codes and Product Codes", IEEE Journal on Selected Areas in Communications, vol. 16, No. 2. Feb. 1998, pp. 276-296.*

Garrett et al., "Low Power Architecture of the Soft-Output Viterbi Algorithm", 1998 International Symposium on Low Power Electronics and Design, Aug. 1998, pp. 262-267.*

Narayanan et al., "Product Accumulate Codes: Properties and Performance", IEEE ITW 2001, Sep. 2001, pp. 21-23.*

* cited by examiner

*Primary Examiner*—Stephen M. Baker
(74) *Attorney, Agent, or Firm*—Matthew C. Loppnow

(57) ABSTRACT

A system and method for decoding a block code includes receiving a first word. The first word includes parity bit values and information bit values. A first partial word including the information bit values and a first subset of the parity bit values is generated. The first partial word is decoded to generate a first refined word. The first refined word includes a first set of refined information bit values. A second partial word including the first set of refined information bit values and a second subset of the parity bit values is generated. The second partial word is decoded to generate a second refined word, the second refined word including a second set of refined information bit values.

19 Claims, 3 Drawing Sheets

METHOD AND APPARATUS FOR TURBO DECODING BLOCK CODES

BACKGROUND OF THE INVENTION

Field of the Invention

This invention relates generally to wireless data transmission, and, more particularly, to a method and apparatus for turbo decoding block codes.

Many wireless data transmissions occur under noisy conditions. Paging systems represent one such application. Various forward error-correcting techniques have been developed to allow the receiving unit to identify and correct errors in the transmitted data. One such forward error-correcting technique uses a series of parity bits that are generated by linear combinations of the information bits. The parity bits are transmitted with the information bits and are used by the receiver to correct some of the transmission errors. Numerous equation schemes may be used for generating the parity bits. Typically, the equations are represented in matrix form. The information vector (i.e., series of data bits) is multiplied by a generator matrix that includes the parity equations to generate the parity bits. The combination of the information bits and the parity bits is commonly referred to as a codeword. The receiver, based on its a priori knowledge of the parity equations, can correct errors in the received codewords.

Codes that generate a set of parity bits from a fixed set of information bits are commonly referred to as block codes. Bose-Chaudhuri-Hocquenghem Codes (BCH codes) constitute an exemplary family of block codes. The (31,21) BCH code uses 21 information bits and 10 parity bits. An extended BCH code uses an additional even parity bit (i.e.,(32,21)). The resulting (32,21) code can correct all double-error patterns and detect all triple-error patterns.

Another type of code, commonly referred to as a convolutional code, produces current encoded symbols based on a certain number of previous data values. This history component allows better error correcting capabilities than with block codes.

For wireless applications, channel coding is an important tool for improving communications reliability. Turbo codes, introduced in 1993 by C. Berrou, A. Glavieux, and P. Thitimajshima, provide error control performance within a few tenths of a dB of the Shannon limit using decoders that are less complex than those of the former NASA/ESA standard. Turbo error control allows for an increase in range and/or data rate. The benefits of turbo coding are particularly evident in wireless personal communication systems, where bandwidth demands are beginning a steep upward turn driven by a demand for increased data services. Turbo codes are part of the Third Generation (3G) cellular standards to be deployed in the upcoming years.

Generally, in the decoding process of a digital system, the use of soft information, delivered by a demodulator, has been shown to achieve significant gain over a strictly hard decision technique. Knowledge of channel measurement information allows a soft decision decoder to estimate the reliability of the observation symbols and treat them accordingly. A hard decision decoder, on the other hand, operates on the received values regardless of their degree of reliability by mapping them onto the code alphabet. The hard decision technique cannot distinguish small errors from large ones.

The Viterbi algorithm is one technique that can incorporate soft information in its metric computation. A key point in the use of Viterbi is the ability to represent a given code with a trellis, on which the algorithm performs maximum likelihood (ML) decoding. Both block and convolutional codes exhibit a trellis representation. However, the two families of codes have a very different trellis construction process, yielding a completely different trellis structure. Unlike convolutional codes, whose trellises are characterized by a regular structure and a constant number of states, trellises for block codes are extremely irregular, and depend highly on the choice of the generating matrix. The complexity of the decoding operation is closely related to the complexity of the trellis itself. For a (n, k) linear block code, the complexity grows exponentially with min(k, n−k). So, for a block code of rate greater than ½, the complexity of the trellis is exponentially proportional to the code redundancy. Hence, a straightforward soft decoding approach is not practical for block codes with large redundancy, due to the excessive complexity of the trellis.

The present invention is directed to overcoming, or at least reducing the effects of, one or more of the problems set forth above.

BRIEF DESCRIPTION OF THE DRAWINGS

The invention may be understood by reference to the following description taken in conjunction with the accompanying drawing, in which like reference numerals identify like elements, and in which.

Figure 1:
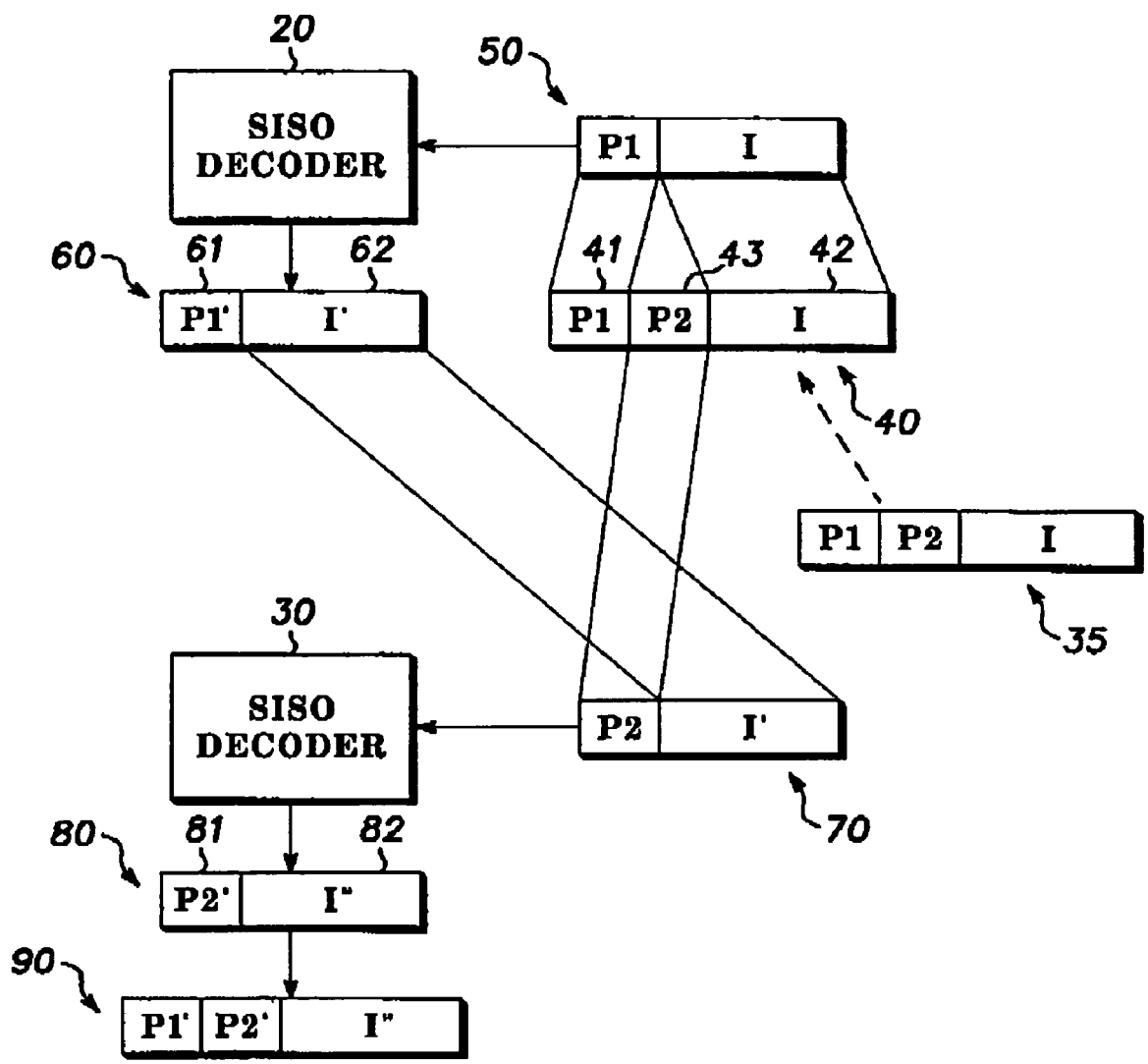
FIG. 1 is a simplified functional diagram of a decoding system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE PREFERRED EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the Figures, and, particularly, to FIG. 1, a simplified functional diagram of a decoding system 10 in accordance with one embodiment of the present invention is shown. The decoding system 10 is adapted to process a block code, such as a BCH code. The decoding system 10 decomposes the block code into a plurality of subcodes. The following illustration is presented within the context of a BCH code, however, the invention is not so limited, and any block code may be used.

Consider a (n, k) block code with p=n−k parity bits. Each parity bit is involved in only one of the parity equations and is generated based only on the information bits. A valid codeword must satisfy each of the parity bit equations. The p parity bits, and their associated equations, are separated into two disjoint subsets of size p1 and p2 (i.e., p=p1+p2). Accordingly, any given codeword may be seen as the parallel concatenation of p1 parity bits generated from the first subset of parity equations, p2 parity bits generated from the second subset of parity equations, and k information bits. Hence, the (n, k) codeword may be viewed as the parallel concatenation of two constituent codes, a (k+p1, k) code, C1, and a (k+p2, k) code, C2.

The sizes of the subsets may or may not be equal. For example, the 10 parity bits in the (31, 21) BCH code may be divided into two sets of 5, or alternatively, into one set of 6 and one set of 4. In block code implementations with an odd number of parity bits, the division is necessarily not equal.

A typical parity matrix, H, for a (15, 7) BCH code is:

$$H = \begin{bmatrix} 1 & 0 & 0 & 0 & 0 & 0 & 0 & 0 & 1 & 1 & 0 & 1 & 0 & 0 & 0 \\ 0 & 1 & 0 & 0 & 0 & 0 & 0 & 0 & 0 & 1 & 1 & 0 & 1 & 0 & 0 \\ 0 & 0 & 1 & 0 & 0 & 0 & 0 & 0 & 0 & 0 & 1 & 1 & 0 & 1 & 0 \\ 0 & 0 & 0 & 1 & 0 & 0 & 0 & 0 & 0 & 0 & 0 & 1 & 1 & 0 & 1 \\ 0 & 0 & 0 & 0 & 1 & 0 & 0 & 0 & 1 & 1 & 0 & 1 & 1 & 1 & 0 \\ 0 & 0 & 0 & 0 & 0 & 1 & 0 & 0 & 0 & 1 & 1 & 0 & 1 & 1 & 1 \\ 0 & 0 & 0 & 0 & 0 & 0 & 1 & 0 & 1 & 1 & 1 & 0 & 0 & 1 & 1 \\ 0 & 0 & 0 & 0 & 0 & 0 & 0 & 1 & 1 & 0 & 1 & 0 & 0 & 0 & 1 \end{bmatrix} \quad (1)$$

The parity matrix, H, is subdivided to generate component parity submatrices, H1 and H2 for the C1 and C23 constituent subcodes. To generate the component parity submatrix, H1, the first p1 rows of the parity matrix, H, are selected and the all-zero columns are removed. Likewise, to generate the component parity submatrix, H2, the last p2 rows of the parity matrix, H, are selected and the all-zero columns are removed.

$$H1 = \begin{bmatrix} 1 & 0 & 0 & 0 & 1 & 1 & 0 & 1 & 0 & 0 & 0 \\ 0 & 1 & 0 & 0 & 0 & 1 & 1 & 0 & 1 & 0 & 0 \\ 0 & 0 & 1 & 0 & 0 & 0 & 1 & 1 & 0 & 1 & 0 \\ 0 & 0 & 0 & 1 & 0 & 0 & 0 & 1 & 1 & 0 & 1 \end{bmatrix} \quad (2)$$

$$H2 = \begin{bmatrix} 1 & 0 & 0 & 0 & 1 & 1 & 0 & 1 & 1 & 1 & 0 \\ 0 & 1 & 0 & 0 & 0 & 1 & 1 & 0 & 1 & 1 & 1 \\ 0 & 0 & 1 & 0 & 1 & 1 & 1 & 0 & 0 & 1 & 1 \\ 0 & 0 & 0 & 1 & 1 & 0 & 0 & 0 & 0 & 0 & 1 \end{bmatrix} \quad (3)$$

The parity submatrices H1 and H2 are used to construct subtrellises useful for performing soft decision decoding. The individual subtrellises are significantly less complex than a trellis constructed based on the larger, parent parity matrix, H.

As seen in FIG. 1, the decoding system 10 includes two SISO decoders 20, 30. In the illustrated embodiment, the SISO decoders 20, 30 implement a soft-in soft-out (SISO) algorithm. For example, a SISO algorithm such as a BCJR (Bahl, Cocke, Jelinek, Raviv) algorithm may be used. Additionally, an algorithm that uses soft input information to generate a plurality of candidate codewords may be used in conjunction with a combining technique to generate soft outputs. Exemplary algorithms such as list-Viterbi, Chase, and Generalized Minimum Distance may be used. The particular construct and operation of the SISO decoders 20, 30 are well known to those of ordinary skill in the art, and for clarity and ease of illustration, they are not described in complete detail herein.

Consider a codeword, $c=(c_1, \ldots, c_{11})$, of a (n, k) code. Assume a bit-to-symbol mapping of:

$$\Theta: c_i \in \{0,1\} \rightarrow s_i \in \{-1,+1\}, \quad (4)$$

and let $r=(r_1, \ldots, r_{11})$ be the output of a discrete additive white Gaussian noise (AWGN) channel with:

$$r_i = s_i + n_i, \quad (5)$$

$$n_i = N(0, \delta^2), \text{ and} \quad (6)$$

$$s_i = \Theta(c_i) = (2 \times c_i - 1). \quad (7)$$

The decoding system 10 receives a vector 40, containing the channel observations $r_i$, provided by a matched filter (not shown). The values in the observation vector 40 are soft values related to the parity bits, P1, P2 and the information bits, I. These soft values are expressed as floating point values, that approach infinity for a binary 1 and negative infinity for a binary 0. Note that a reverse mapping may be used. The sign of $r_i$ represents the hard decision on the corresponding bit, $c_i$, and its magnitude is proportional to the reliability of that decision.

The SISO decoder 20 receives a first partial word 50 that includes the segments of the observation vector 40 which correspond to the first p1 parity bits, P1 41 and the information bits, I 42.

The SISO decoder 20 computes an estimate of a log likelihood ratio (LLR) defined by:

$$LLR(d_i) = \ln\left(\frac{Pr(s_i = +1 \mid r)}{Pr(s_i = -1 \mid r)}\right), \quad (8)$$

where $C_i^k$ is the subset of the code C yielding to the symbol k at the ith location after symbol mapping.

Let d(r/c) be the Euclidian distance between the received word, r, and the transmitted codeword, c, defined as follows:

$$d(r, c) = \sum_{i=1}^{n} |r_i - s_i|^2. \quad (9)$$

The probability of receiving r, given the transmitted codeword, c is defined by:

$$Pr(r \mid c) = \left(\frac{1}{\sqrt{2\pi\sigma^2}}\right)^n \exp\left(-\frac{d(r, c)}{2\sigma^2}\right) \quad (10)$$

and decays exponentially with the Euclidian distance separating r and c.

A reasonable assumption is to consider that the main contribution to each summation, in the LLR expression, is due to a single codeword for each decision. In other words, a good approximation of the LLR can be given based on the knowledge of two codewords only: $c_i^+$ at the minimum Euclidian distance from r, with a +1 in the ith position, and its direct concurrent $c_i^-$, at the minimum Euclidian distance, with a −1 in the ith position instead.

The output of the SISO decoder 20 is, therefore, a vector of soft values that area a refinement of the channel observations. The output of the SISO decoder 20 is defined as follows:

$$r_i = \frac{d(r, c_i^-) - d(r, c_i^+)}{4} \quad (11)$$

The SISO decoder 20 generates a second partial work 60 that includes refined soft values, P1' 61 and I' 62 for the parity and information bits (i.e., more accurate than the first partial word 50).

In the illustrated embodiment, a list-Viterbi Algorithm (LVA) is used. Providing the decoder 20 with a smaller parity matrix than the original enables the construction of a trellis structure with reduced complexity. The decoder 20 can be adapted to receive a first partial parity matrix. As the input sequence is not the whole received word but just a section of it of length, k+pi, the algorithm will find the L most likely sequences of same length that satisfy the set of input parity equations. The L most likely sequences are combined according to Equation 11 to generate new reliability estimates.

The refined soft values for the information bits I' 62 are concatenated with the soft values for the second p2 parity bits, P2 43, from the word vector 40 to generate a third partial word 70. The third partial word 70 is supplied to the second SISO decoder 30. Because the second SISO decoder 30 uses soft information for parity bits that are based on parity equations that are independent from those used by the first SISO decoder 20, the reliability of the soft values for the information bits can be further increased. The SISO decoder 30 uses a SISO technique (i.e., similar to the operation of the decoder 20 described above) to generate a fourth partial word 80 that includes refined soft values, P2' 81 and I" 82 for the parity and information bits. Thus, the decoder 30 can be adapted to receive a second partial parity matrix.

The refined parity bit soft values P1' 61, P2' 81 and the refined information bit soft value I" 82 may be used to generate a second word 90. The process may be repeated in an iterative fashion by replacing the codeword with the second word 90 in the process. In the illustrated embodiment, the number of iterations used is 2; however, other numbers of iterations may be used. There is a computational cost vs. performance gain tradeoff that results in diminishing returns for increasing numbers of iterations.

Figure 2:
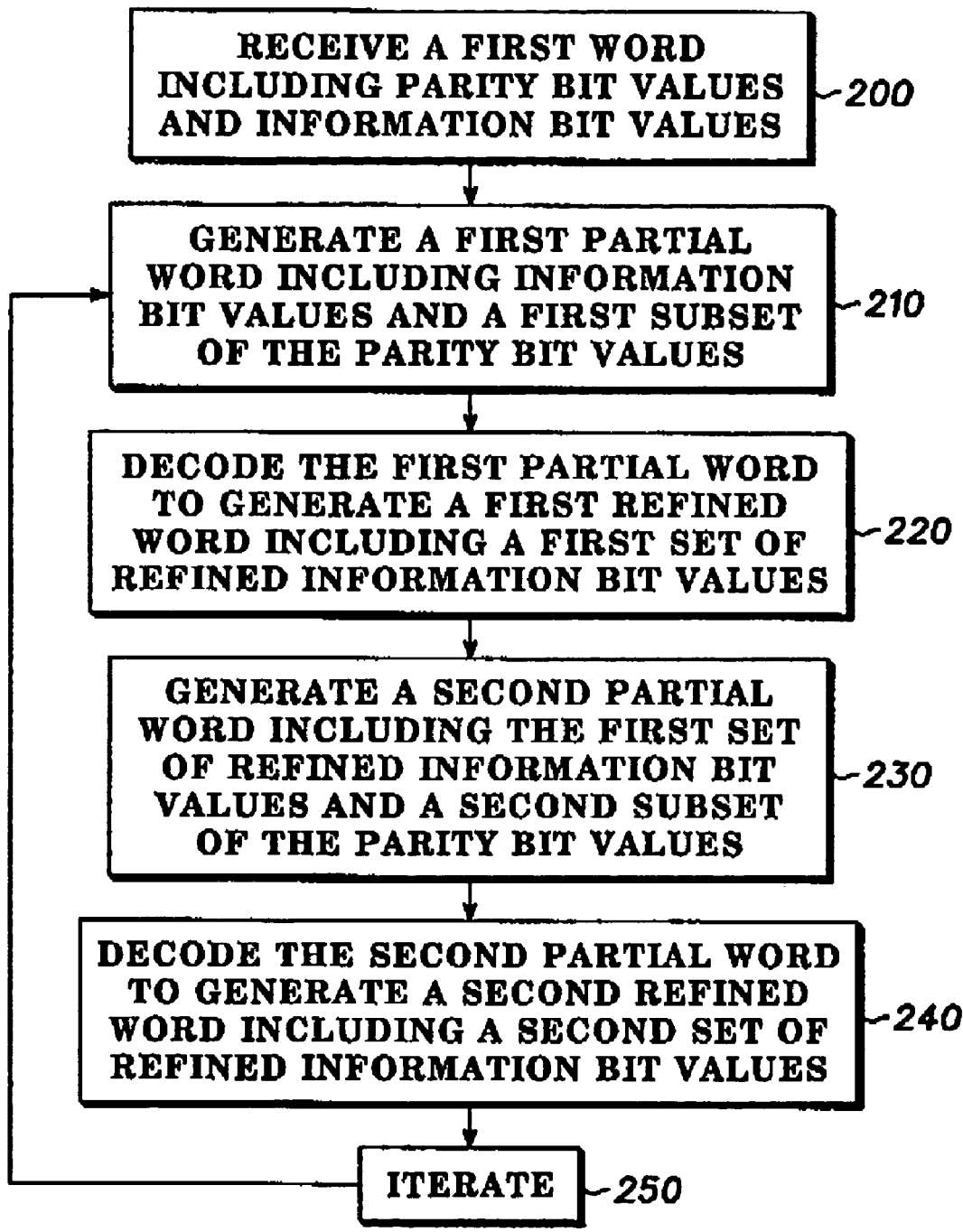
FIG. 2 is a flow diagram of a method for decoding a block code in accordance with another embodiment of the present invention.

Turning now to FIG. 2, a flow diagram of a method for decoding a block code is provided. In block 200, a first word is received. The first word includes parity bit values and information bit values. In block 210, a first partial word including the information bit values and a first subset of the parity bit values is generated. In block 220, the first partial word is decoded to generate a first refined word. The first refined word includes a first set of refined information bit values. In block 230, a second partial word including the first set of refined information bit values and a second subset of the parity bit values is generated. In block 240, the second partial word is decoded to generate a second refined word. The second refined word includes a second set of refined information bit values. In block 250, the method is iterated by returning to block 210 and using the first and second sets of refined parity bit values and the second set of refined information bit values.

Figure 3:
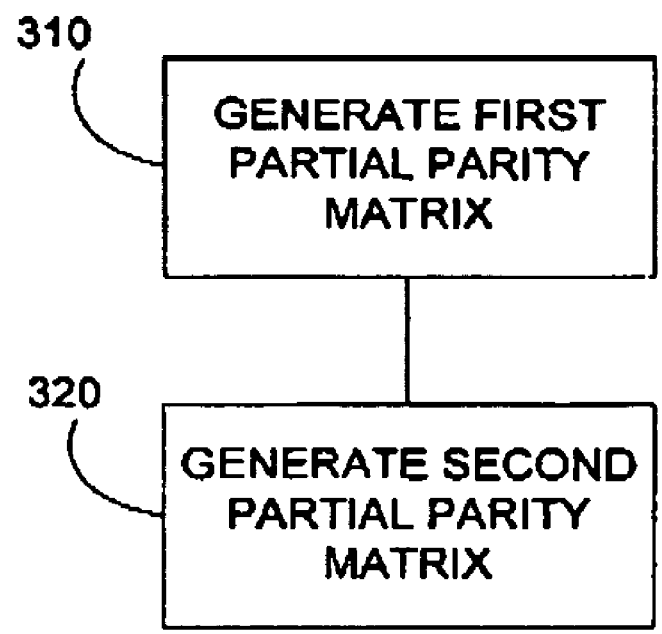
FIG. 3 is a flow diagram of a method for decoding a block code in accordance with another embodiment of the present invention.

FIG. 3 is a flow diagram of a method for decoding a block code that can be combined with FIG. 2 in accordance with another embodiment of the present invention. In step 310, a first partial parity matrix is generated based on parity bits associated with a first subset of parity bit values. In step 320, a second partial parity matrix is generated based on parity bits associated with a second subset of parity bit values.

Decomposing a block code into a plurality of subcodes and decoding the subcodes using soft decision techniques as described above has numerous advantages. First, the soft decision techniques are more accurate than a hard coded solution. Second, decoding the subcodes is computationally less taxing than decoding the larger parent code. This makes the use of soft coding technique feasible for a code with a high degree of redundancy. Accuracy may be increased without the requisite cost of a full size soft decision solution.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A decoding system for decoding block codes comprising information bits and parity bits, comprising:
    a first decoder adapted to receive a first partial word including a first set of parity bit values associated with a first subset of the parity bits and a first set of information bit values, the first decoder being adapted to decode the first partial word and generate a first refined word including a first set of refined information bit values; and
    a second decoder adapted to receive a second partial word including a second set of parity bit values associated with a second subset of the parity bits and the first set of refined information bit values, the second decoder being adapted to decode the second partial word and generate a second refined word including a second set of refined information bit values,
    wherein the first decoder is adapted to receive a first partial parity matrix and decode the first partial word based on the first partial parity matrix, the first partial parity matrix being based on the first subset of the parity bits.

2. The decoding system of claim 1, wherein the second decoder is adapted to receive a second partial parity matrix and decode the second partial word based on the second partial parity matrix, the second partial party matrix being based on the second subset of the parity bits.

3. The decoding system of claim 1, the first and second decoders are adapted to decode the first and second partial words based on a trellis decoding algorithm.

4. The decoding system of claim 1, the first and second decoders are adapted to decode the first and second partial words based on an algebraic decoding algorithm.

5. The decoding system of claim 1, wherein the parity bit values and the information bit values comprise log likelihood ratio values.

6. The decoding system of claim 1, wherein the first refined word includes a first plurality of refined parity bit values, the second refined word includes a second plurality of refined parity bit values, and the first decoder and second decoders are adapted to iterate the decoding process based on a first refined word including the first and second sets of refined parity bit values and the second set of refined information bit values.

7. The decoding system of claim 6, wherein the first and second decoders are adapted to iterate at least two times.

8. A method for decoding a block code, comprising:
receiving a first word, the first word including parity bit values and information bit values;
generating a first partial word including the information bit values and a first subset of the parity bit values;
decoding the first partial word to generate a first refined word, the first refined word including a first set of refined information bit values;
generating a second partial word including the first set of refined information bit values and a second subset of the parity bit values; and
decoding the second partial word to generate a second refined word, the second refined word including a second set of refined information bit values,
wherein the block code includes a plurality of information bits and a plurality of parity bits generated based on the information bits, and the method further includes generating a first partial parity matrix based on the parity bits associated with the first subset of the parity bit values.

9. The method of claim 8, wherein decoding the first partial word includes decoding the first partial word based on the first partial parity matrix.

10. The method of claim 8, where decoding the first and second partial words includes decoding the first and second partial words based on a trellis decoding algorithm.

11. The method of claim 8, wherein decoding the first and second partial words includes decoding the first and second partial words based on an algebraic decoding algorithm.

12. The method of claim 8, wherein receiving the first word includes receiving the first word including parity bit values and information bit values, the parity bit values and the information bit values comprising log likelihood ratio values.

13. The method of claim 8, further comprising generating a second partial parity matrix based on the parity bits associated with the first subset of the parity bit values.

14. The method of claim 13, wherein decoding the second partial word includes decoding the second partial word based on the second partial parity matrix.

15. The method of claim 8, wherein the first refined word includes a first plurality of refined parity bit values, the second refined word includes a second plurality of refined parity bit values, and the method further comprises generating a second word based on the first and second pluralities of refined parity bit values and the second set of refined information bit values.

16. The method of claim 15, further comprising iterating the generating and decoding steps based on the second word.

17. The method of claim 16, wherein iterating the generating and decoding steps includes iterating the generating and decoding steps at least two times.

18. A decoding system for decoding block codes comprising information bits and parity bits, comprising:
a first decoder adapted to receive a first partial word including a first set of parity bit values associated with a first subset of the parity bits and a first set of information bit values, the first decoder being adapted to decode the first partial word and generate a first refined word including a first set of refined information bit values; and
a second decoder adapted to receive a second partial word including a second set of parity bit values associated with a second subset of the parity bits and the first set of refined information bit values, the second decoder being adapted to decode the second partial word and generate a second refined word including a second set of refined information bit values,
wherein the first refined word includes a first plurality of refined parity bit values, the second refined word includes a second plurality of refined parity bit values, and the first decoder and second decoders are adapted to iterate the decoding process based on a first refined word including the first and second sets of refined parity bit values and the second set of refined information bit values.

19. The decoding system of claim 18, wherein the first and second decoders are adapted to iterate at least two times.

* * * * *